United States Patent [19]  
Hagiwara et al.

[11] Patent Number: 4,972,299  
[45] Date of Patent: Nov. 20, 1990

[54] CHIP TYPE CAPACITOR AND MANUFACTURING THEREOF

[75] Inventors: Ikuo Hagiwara; Susumu Ando; Masayuki Fujiwara; Keiichi Endo; Makoto Hirano, all of Tokyo, Japan

[73] Assignee: Nippon Chemi-Con Corporation, Tokyo, Japan

[21] Appl. No.: 281,456

[22] Filed: Dec. 8, 1988

[30] Foreign Application Priority Data

| Dec. 9, 1987 | [JP] | Japan | 62-311409 |
| Dec. 9, 1987 | [JP] | Japan | 62-311410 |
| Dec. 9, 1987 | [JP] | Japan | 62-311412 |
| Dec. 24, 1987 | [JP] | Japan | 62-328032 |
| Dec. 28, 1987 | [JP] | Japan | 62-332923 |
| Feb. 26, 1988 | [JP] | Japan | 63-43681 |
| Apr. 15, 1988 | [JP] | Japan | 63-92885 |
| Apr. 30, 1988 | [JP] | Japan | 63-108414 |
| Apr. 30, 1988 | [JP] | Japan | 63-108415 |
| Jun. 15, 1988 | [JP] | Japan | 63-147880 |
| Jun. 29, 1988 | [JP] | Japan | 63-161430 |

[51] Int. Cl.⁵ ............................................. H01G 9/00  
[52] U.S. Cl. .................................... 361/540; 361/404  
[58] Field of Search ............... 361/538, 539, 540, 404, 361/405, 408, 417, 306; 29/25.42

[56] References Cited

U.S. PATENT DOCUMENTS 4,591,951  5/1986  Iwamoto et al. ............... 361/405 X  
4,656,556  4/1987  Westermann ....................... 361/307

FOREIGN PATENT DOCUMENTS 2508702  9/1976  Fed. Rep. of Germany ...... 361/405

Primary Examiner—Donald A. Griffin  
Attorney, Agent, or Firm—Young & Thompson

[57] ABSTRACT

There is disclosed a chip type capacitor characterized by comprising a capacitor having lead wires derived from a terminal thereof and a sheathing frame having an accommodating space compatible with a dimension of an external shape of said capacitor, wherein a protuberance of a height substantially identical to the dimension of an external diameter of the lead wires of the capacitor is provided on the underside of the sheathing frame and the lead wires of the capacitor accommodated in the sheathing frame are bent alongside from an end of the aperture of the sheathing frame to the underside of the sheathing.

15 Claims, 8 Drawing Sheets

FIG. 14a
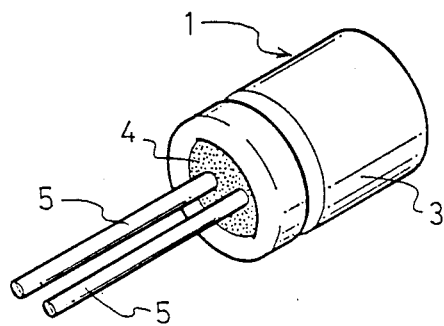
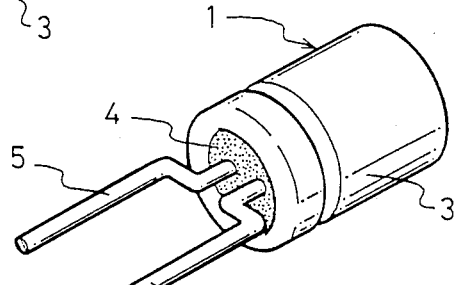
FIG. 14b
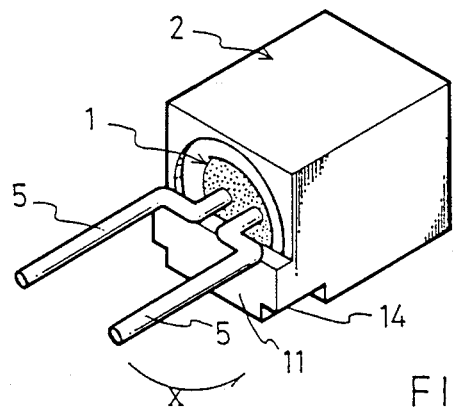
FIG. 14c
FIG. 15
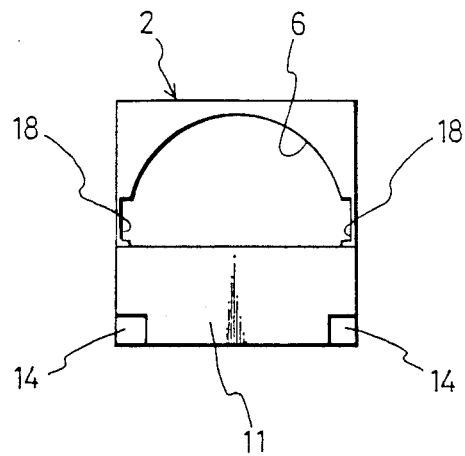

CHIP TYPE CAPACITOR AND MANUFACTURING THEREOF

FIELD OF THE INVENTION

This invention relates to an improvement of a chip type capacitor suitable for mounting on the surface of a printed circuit board.

BACKGROUND OF THE INVENTION

Hitherto, the capacitor chipping has been realized such that a capacitor element is first accommodated in a sheathing case of the synthetic resin for subjecting to a resin mold processing and then the terminals used for an exterior connection terminal derived from an end of the resin were bent alongside the end of the resin to match with the wiring pattern of the printed circuit board.

Further, there is proposed to accommodate the conventional capacitor in a sheathing frame and to arrange the terminals in the same plane as the end of the sheathing frame as disclosed in the Japanese Utility Model Publication 59-3557. Furthermore, another proposal is to arrange a capacitor on a closed-end cylindrical sheathing frame for derivation of the terminals from a through-hole on the underside of the sheathing frame and to bend the terminals in a concave section provided on the external surface of the sheathing frame as disclosed in the Japanese laid-open patent publication 60-245116 and the Japanese laid-open patent publication 60-24511.

These conventional chip type capacitors are capable of a surface mounting without changing the ordinary structure of the capacitor.

SUMMARY OF THE INVENTION

However, in the conventional chip type capacitor with the mold processing, capacitor elements are likely to have a heat deterioration due to a thermal stress during the mold processing. Moreover, particularly for an electrolytic capacitor, it is necessary to mold an electrolyte in a liquid state together with capacitor elements and since the mold processing requires sophisticated sealing properties, the manufacturing process is likely complex.

Moreover, in the chip type capacitors in which an ordinary capacitor is accommodated in the sheathing frame, there have been neither means available for suspending a body of the capacitor in the accommodating space provided in the sheathing frame nor means to determine the position of the body of the capacitor in the sheathing frame, for which reason it will not only cause the position used as a reference for the bending process of the lead wire to be unreliable but generate an unnecessary stress to be applied on the lead wire, which may affect capacitor elements badly in the course of processing.

Furthermore, as the case may be, the body of the capacitor easily falls off from the sheathing frame with difficulty in manufacturing a chip type capacitor.

Furthermore, when a capacitor is accommodated in a closed-end cylindrical sheathing frame, fixing and positioning of the body of the capacitor may be available, notwithstanding lead wires must be inserted through the through-hole provided on the underside of the sheathing frame with an inconvenient manufacturing process. In other words, according to this process, normally two lead wires derived from the capacitor must be inserted through the through-hole provided on the underside of the sheathing frame while accommodating the capacitor in the sheathing frame. Accordingly, an adjustment must be made to the directions of the body of the capacitor and the sheathing frame as well as to the position and direction of the lead wires derived from the body of the capacitor, for which reason a high processing accuracy is required resulting in an disadvantage of the sophisticated manufacturing process.

Now, this invention aims to offer a chip type capacitor suitable for mounting on the surface of the printed circuit board without changing the structure of the ordinary capacitor and without being affected by the processing accuracy during manufacturing process.

To achieve the foregoing purpose, there is provided a chip type capacitor characterized by comprising a capacitor having lead wires derived from a terminal thereof and a sheathing frame having an accommodating space compatible with a dimension of an external shape of the capacitor, wherein a protuberance of a height substantially identical to the dimension of an external diameter of the lead wires of the capacitor is provided on an underside of the sheathing frame and the lead wires of the capacitor accommodated in the sheathing frame are bent alongside from an end of the aperture of the sheathing frame to the underside of the sheathing.

A wall section may be arranged at an end of an aperture on one side of the sheathing frame to cover a part thereof and lead wires of the capacitor accommodated in the sheathing frame are bent alongside from an aperture on one side of the sheathing frame to the wall section and the underside.

Further, a chip type capacitor according to the invention is characterized by comprising a capacitor having lead wires derived from an end section thereof and a sheathing frame having an accommodating space compatible with the dimension of an external shape of said capacitor, wherein a wall section is provided at an end of the aperture on one side of the sheathing frame to cover a part thereof, notched slot sections are provided on the underside of the sheathing frame or on the side adjacent thereto to accommodate lead wires, and lead wires are bent alongside from one side of the aperture to the wall section and the slot sections to expose lead wires out of the side of the sheathing frame.

In a chip type capacitor according to the invention, slot sections may be arranged on the wall section provided at an end of the aperture on one side of the sheathing frame for covering a part thereof over which lead wires of the capacitor are bent to accommodate lead wires, while a protuberance of a height at least higher than the dimension of the external diameter of the lead wires of the capacitor may be arranged on the wall section arranged at the end of aperture on one side of the sheathing frame for covering a part thereof and further a protuberance of a height substantially identical to the height of the protuberance arranged on the wall section may be formed at an end of the aperture provided on the protuberance.

Further, lead wires of the capacitor accommodated in the sheathing frame may be bent alongside from one end of the aperture of the sheathing frame to the underside thereof and also at least a lead wire on one side is led to an end opposed to the leading side of lead wires of the sheathing frame and also a resin layer may be arranged for one side of aperture of the sheathing frame from which lead wires of the capacitor accommodated in the sheathing frame are led out to cover at least a lead-out section of lead wires from the capacitor sealing body.

Moreover, a method of manufacturing a chip type capacitor comprised of a capacitor having lead wires derived from an end section thereof and a sheathing frame having an accommodating space compatible with the dimension of the external diameter of the capacitor is characterized by providing a distance between each lead wire derived from the end of the capacitor to the desired distances and accommodating the capacitor in the sheathing frame before bending the lead wires alongside from an end of the aperture of the sheathing frame to the underside thereof.

In a method of manufacturing a chip type capacitor according to the invention, a distance between each lead wire may be provided beforehand larger than the dimension of the external shape of the capacitor and also lead wires are bent in the vicinity of a lead-out section of lead wires derived from an end of the aperture of the sheathing frame and then tacked below the dimension of the internal diameter of the accommodating space of the sheathing frame and the capacitor is accommodated into the sheathing frame before lead wires are again bent at the lead-out section for restoration to the original dimension.

Furthermore, a capacitor may be accommodated in the sheathing frame and a resin layer may be provided in one side of the aperture of the sheathing frame from which lead wires of the capacitor are derived at least to cover a lead-out section of lead wires from the capacitor sealing body before lead wires are bent alongside from the end of the aperture of the sheathing frame to the underside thereof.

In the chip type capacitor according to the invention, lead wires of the capacitor are bent alongside from the aperture of the sheathing frame having an accommodating space in its inside to the underside thereof and either a groove section or a protuberance is formed on the underside of the sheathing frame, so that the underside of the sheathing frame and the lead wires are provided in the same plane enabling to mount lead wires on the surface of the printed circuit board.

Moreover, a body of the capacitor is accommodated in the accommodating space from one aperture of the sheathing frame and then the lead wires of the capacitor are protruded to the outside from the other aperture of the sheathing frame. Accordingly, the chip type capacitor according to the invention requires no substantial processing accuracy as required in the conventional one but possibly allows to cover the body of the capacitor with the sheathing frame.

Furthermore, the body of the capacitor accommodated in the sheathing frame is suspended in the accommodating space by the wall section which covers an aperture on one side of the sheathing frame, and the position thereof in the accommodating space is conveniently determined. For this reason, it is unnecessary to carry out the positioning and the like of the body of the capacitor in the accommodating space during the bending process of lead wires, and the body of the capacitor does not fall off during manufacturing process or from the completed chip type capacitor.

Therefore, according to the manufacturing method of the chip type capacitor of the invention, the bending process of the lead wires may be conveniently performed permitting the lead wires of the capacitor to provide the distance compatible with the distance of the wiring pattern of the printed circuit board.

Preferred embodiments of the chip type capacitor according to the invention and the manufacturing method thereof are described below in detail with reference to the accompanying drawings in which:

BRIEF DESCRIPTION OF THE DRAWINGS

FIGS. 14(a), (b) and (c) are pictorial views of the manufacturing process descriptive of embodiments of the chip type capacitor according to the invention;

FIG. 15 is a front elevation showing an example of change in shape of the sheathing frame used in the manufacturing method of the chip type capacitor as shown in FIG. 14;

PREFERRED EMBODIMENTS OF THE INVENTION

Figure 1:
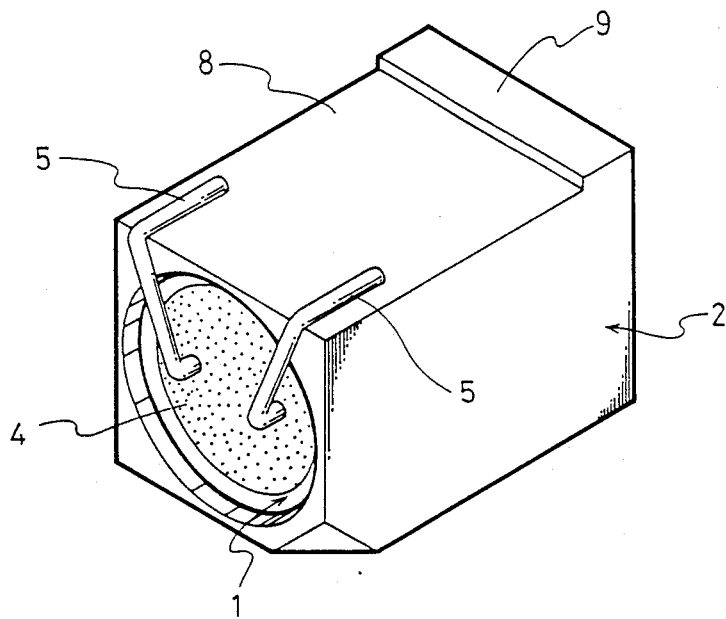
FIG. 1 is a perspective view showing one embodiment of the chip type capacitor according to the invention.
Figure 2:
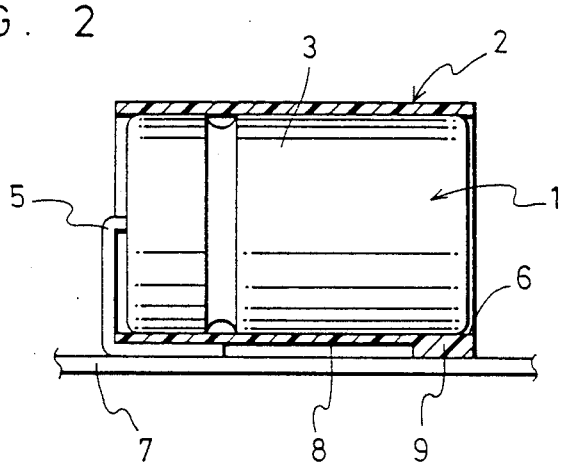
FIG. 2 is a partially enlarged sectional side view of FIG. 1.

FIGS. 1 and 2 illustrate one embodiment of the chip type capacitor according to the invention. In FIGS. 1 and 2, the reference numerals 1 represents the capacitor and 2 stands for the sheathing frame.

The body of the capacitor 1 is comprised of the configuration wherein capacitor elements formed by winding an electrode foil and an electrolytic paper (not shown in the drawings) are accommodated in a closed-end cylindrical sheathing case 3 of aluminum and the like, and an end of an aperture of the sheathing case 3 is sealed with a sealing member 4. Lead wires 5,5 derived from capacitor elements are led out to the outside through the sealing compound 4. On the contrary, the sheathing frame 2 has a cylindrical accommodating space 6 compatible with the dimension of the external diameter of the capacitor 1 and is composed of an excellent heat resistant material. The sheathing frame 2 is preferably molded from excellent heat resistant synthetic resins such as epoxy, phenol, polymide and the like, ceramics materials or excellent heat resistant elastic rubber materials.

In this embodiment, the accommodating space 5 of the sheathing frame 2 employs the cylindrical capacitor 1 for its external shape so that it is formed into the cylindrical shape having the dimension substantially identical to the dimension of the external diameter of the capacitor 1. However, when the capacitor of non-cylindrical exrternal shape, for instance, the capacitor 1 with its sectional shape formed into an ellipsoid is used, the configuration ought to be made to provide an ellipse cylindrical accommodating space 6 compatible with such configuration. Accordingly, according to this embodiment, the capacitor 1 is accommodated in the sheathing frame 2 having the accommodating space 6 as shown in FIG. 2.

Further in this embodiment, the sheathing frame 2 at its one side 8 or the mounting underside of a printed circuit board 7 is provided with a protuberance 9 formed into the dimension of the height substantially identical to the dimension of the external diameters of lead wires 5,5. This protuberance 9 is provided in the vicinity of an edge section of an underside 8 where an end face confronting to an end of an aperture 10 of the sheathing frame from which lead wires 5,5 of the capacitor 1 are led out comes into contact with the tip portions of the lead wires 5,5. Accordingly, the protuberance 9 with the tip portions of the lead wires 5,5 entirely support the chip type capacitor. Thus, the lead wires 5,5 used for the external connection are bent substantially in parallel with the end of the capacitor 1 alongside from the lead-out section of the capacitor 1 to the aperture 10 of the sheathing frame 2 and the underside 8 of the sheathing frame 2 to face with the printed circuit bord 7.

The chip type capacitor of this embodiment thus configurated is supported in parallel on the printed circuit board 7 through the tip portion of the lead wires 5,5 and the protuberance 9 as shown in FIG. 2.

According to this embodiment, the protuberance 9 provided in the underside 8 of the sheathing frame 2 represents a continuous convex one alongside the edge section, nevertheless, another shape may be available so far as the dimension of the height substantially identical to the dimension of the external diameter of the lead wires 5,5 is employed. For example, when a non-continuous protuberance is provided in the corner section of the underside 8 of the sheathing frame 2, a clearance to be formed between the chip type capacitor and printed circuit board 7 expands resulting in further improvement in a heat dissipation effect of the soldering heat and the like.

Furthermore, when a protuberance 9 is provided in the clearance between a plurality of bent lead wires 5,5, an undesired diffusion of the soldering may be suspended by the protuberance 9 to prevent a short-circuit accident due to the bridging of the soldering.

Figure 3:
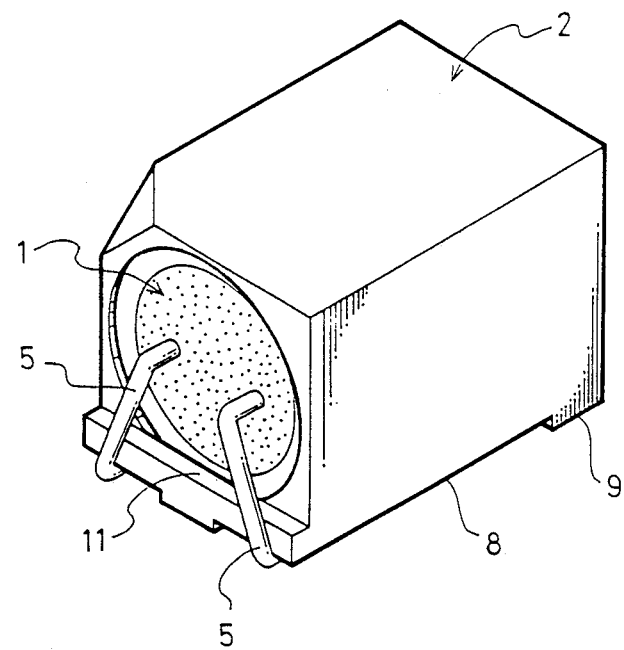
FIG. 3 is a perspective view showing another embodiment of the chip type capacitor according to the invention.
Figure 4:
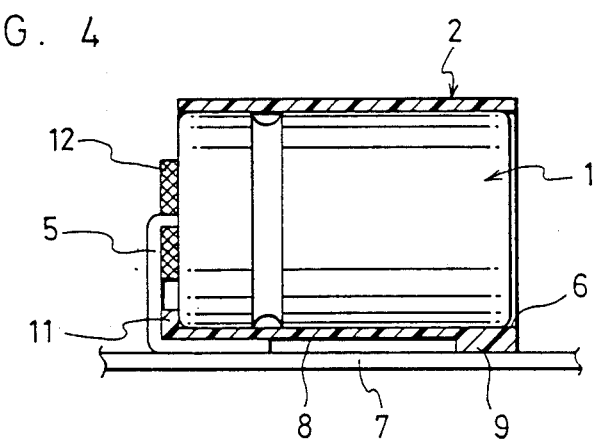
FIG. 4 is a partially enlarged sectional side view of the chip type capacitor of FIG. 3.
Figure 5:
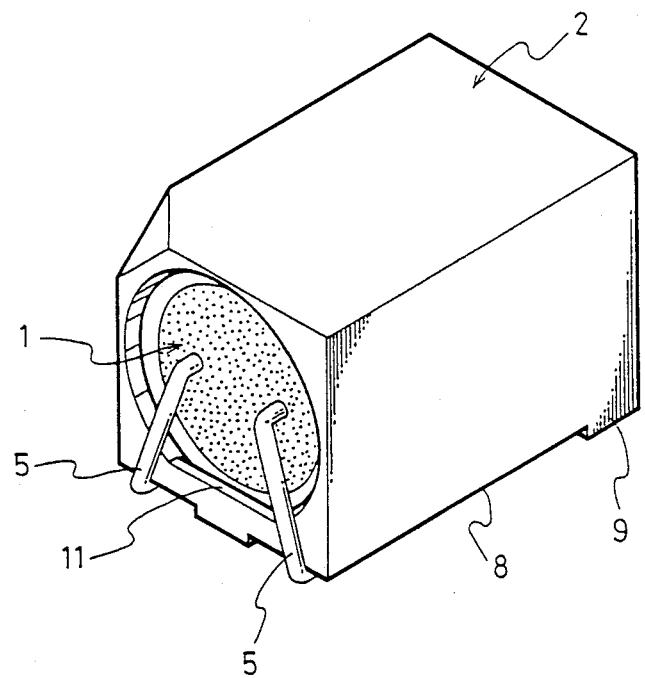
FIG. 5 is a perspective view showing a modified example of the chip type capacitor as shown in FIG. 3.

FIG. 3 to FIG. 5 illustrates another embodiments of the chip type capacitor according to the invention. In FIG. 3, the aperture 10 of the sheathing frame 2 which faces the lead wires 5,5 of the capacitor 1 accommodated in the accommodating space 6 of the sheathing frame 2 has a wall section 11 which covers a part of the aperture 10. The rest of the configurations are the same as for the aforementioned embodiment and accordingly the same reference numerals are applied to the same configurating portions with omission of their detailed descriptions. In other words, according to the embodiment, the body of the capacitor 1 is suspended in the accommodating space 6 of the sheathing frame 2 through the wall section 11 so that the end face of the capacitor 1 is positioned in substantially the same plane as the end of the aperture 10 of the sheathing frame 2.

In this embodiment, the lead wires 5,5 used for the external connection are bent in substantially parallel with the end of the capacitor 1 alongside from the lead-out section of the capacitor 1 to the end of the aperture 10 of the sheathing frame 2 and the underside 8 of the sheathing frame 2 to face the printed circuit board 7 and in the bending process of the lead wires 5,5 when a bending jig 12 is placed in the upper and the lower positions of the lead wires 5,5 to bend them in the upper and lower positions of lead wires 5,5 as shown in FIG. 4, a mechanical stress to be affected to the elements inside the capacitor 1 may be suspended to prevent the bent lead wires 5,5 from protruding out of the end of the sheathing frame 2.

Further, as shown in FIG.5, the wall section 11 may be provided at the aperture 10 of the sheathing frame 2 only to cover the aperture 10 of the sheathing frame 2 and in this case the dimension of the sheathing frame 2 per se may be shortened in comparison with the embodiment as shown in the FIG. 3.

Figure 6:
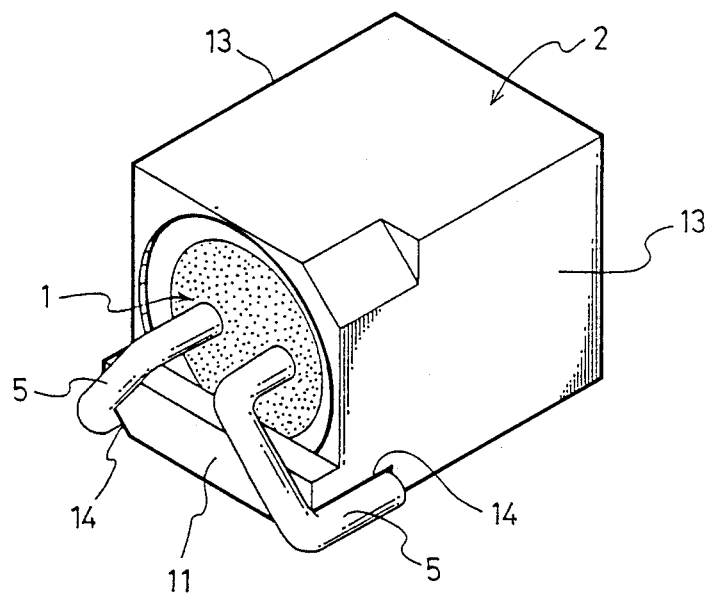
FIG. 6 is a perspective view showing another embodiment of the chip type capacitor according to the invention.
Figures 7, 8:
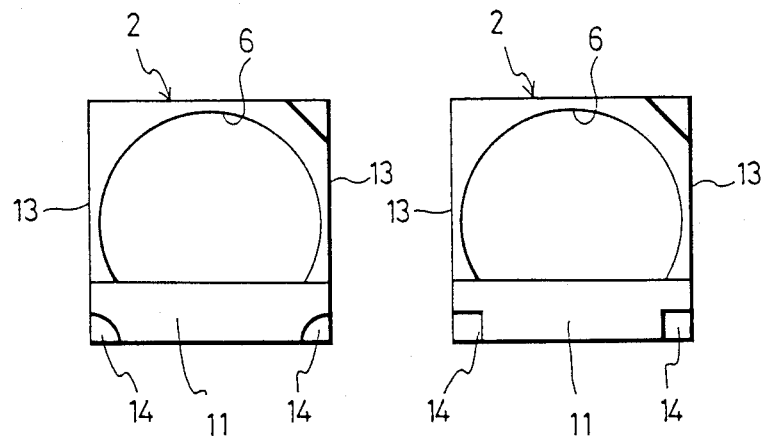
FIG. 7 is a front elevation showing one embodiment of the sheathing frame of the chip type capacitor as shown in FIG. 6.
FIG. 8 is a front elevation showing another embodiment of the sheathing frame of the chip type capacitor as shown in FIG. 6.

FIG. 6 to FIG. 8 illustrates further embodiments of the chip type capacitor according to the invention. Meanwhile, in the embodiments described below, the same reference numerals are applied to the same configurating portions and their detailed descriptions are omitted.

In FIG. 6, according to the embodiment, the notched groove sections 14, 14 are provided in the boundary between either sides 13,13 of the sheathing frame 2 and the underside 8. In this embodiment, groove sections 14,14 were slanted extending from both sides 13,13 of the sheathing frame 2 to the underside 8, nevertheless these groove sections 14,14 should be only suitable for accommodating the lead wires 5,5 and their shapes may optionally be selected.

According to the embodiment, the lead wires 5,5 derived from the end of the capacitor 1 are bent alongside the end of the aperture 10 of the sheathing frame 2 and then accommodated in the groove sections 14,14 provided in either sides 13,13 of the sheathing frame 2 to face the printed circuit board 7. For this reason, the lead wires 5,5 of the capacitor 1 are always provided by constantly distancing or keeping the distance between the groove sections 14,14 arranged on the sheathing frame 2 as shown in FIG. 6 free of an adjustment of the pitch between each of the lead wires 5,5.

Further, in the chip type capacitor according to the embodiment, the lead wires 5,5 of the capacitor 1 are exposed from either sides 13,13 of the sheathing frame 2 so that when they are mounted on the printed circuit board 7 by soldering the bonded portion of the lead wires 5,5 with a soldering layer may be visually viewed from the outside with an improved reliability in the mounting condition.

Meanwhile, the groove sections 14,14 provided from either sides 13,13 of the sheathing frame 2 to the underside 8 may be of any shape suitable for accommodating the lead wires 5,5 of the capacitor 1, for example, they may be of arcs as shown in FIG. 7 or may be of rectangular shapes as shown in FIG. 8.

Figure 9:
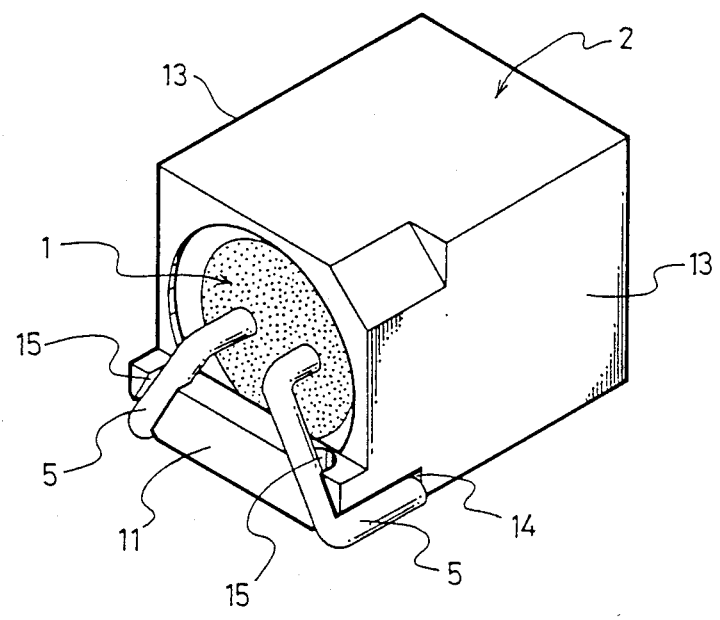
FIG. 9 is a perspective view of an example of change in shape of the chip type capacitor as shown in FIG. 6.

FIG. 9 is a modification of the embodiment as shown in FIG. 6. Namely, according to the embodiment, the groove sections 15,15 are provided in the surface of the wall section 11, which covers the aperture 10 of the sheathing frame 2 alongside the lead wires 5,5 of the capacitor 1 which are bent for contact. These groove sections 15,15 are formed into a shape suited for accommodating the lead wires 5,5 of the capacitor 1, such as a half-round shape. According to the embodiment, the lead wires 5,5 of the capacitor 1 are bent alongside from the end of the aperture 10 of the sheathing frame 2 to the underside 8 but accommodated in the groove sections 15,15 at the wall section 11, so that they do not come out of the end of the aperture 10 of the sheathing frame 2 from which the lead wires 5,5 are led out as in the aforementioned embodiment.

Figure 10:
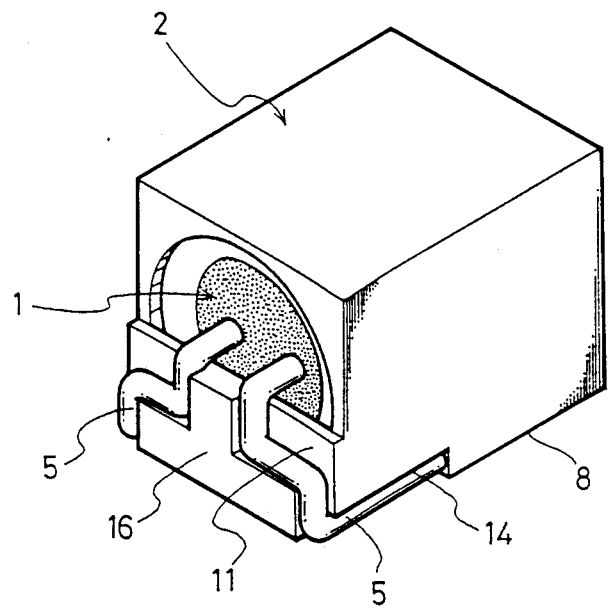
FIG. 10 is a perspective view of another embodiment of the chip type capacitor according to the invention.
Figure 11:
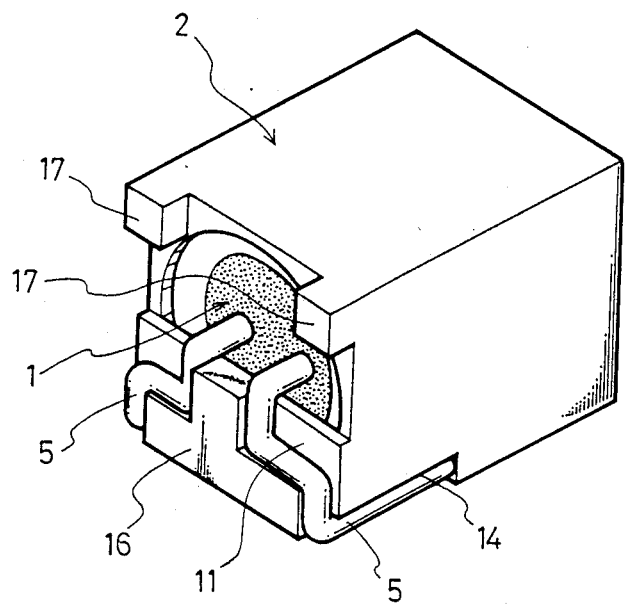
FIG. 11 is a perspective view of an example of change in shape of the chip type capacitor as shown in FIG. 10.

FIG. 10 and FIG. 11 show another embodiment of the chip type capacitor according to the invention. Namely, in this embodiment like the aforementioned embodiment, the wall section 11 is provided at the aperture 10 of the sheathing frame 2 to cover a part thereof and the protuberance 16 is arranged in the vicinity of almost at the center portion of the wall section 11 in the dimension of the height substantially identical to the dimension of the external diameters of the lead wires 5,5. In this case, the lead wires 5,5 are so bent alongside the surface of the wall section 11 to detour the protuberance 16 and are further bent alongside the underside 8 of the sheathing frame 2 for accommodation into the groove sections 14,14 provided on the underside 8. As a result, the protuberance 16 and the lead wires 5,5 are arranged in substantially the same plane at the end of the aperture 10 of the sheathing frame 2.

As hereinbefore described, the protuberance 16 is provided in the vicinity of the center portion of the wall section 11, so that a plurality of the lead wires 5,5 led out from the capacitor 1 are separated from each other through the protuberance 16 to prevent a short-circuit accident to be caused by a contact of the lead wires 5,5 with each other.

However, when the ordinary chip type electronic parts are actually mounted on the printed circuit board 7, the electronic parts at its four sides must be held down at the front and the rear, the right and the left by means of a jig to carry out a positioning process for an adjustment of their wiring positions. According to the chip type capacitor of this embodiment, even electronic parts are held down by the jig during the positioning process, the protuberance 16 comes into contact with the jig, ensuring a precise positioning with reduction of the mechanical stress to the capacitor elements due to the jig.

In the embodiment as illustrated in FIG. 11, like the chip type capacitor as shown in FIG. 10, the protuberance 17 is provided in the aperture 10 of the sheathing frame 2 in the dimension of the height identical to the dimension of the height of the protuberance 16 provided in the wall section 11. In this case, the protuberance 16 of the wall section 11 is arranged in the same plane as the protuberance 17 at the aperture 10 of the sheathing frame 2. Accordingly, like the aforementioned embodiment, the stress to be caused by the jig to the lead wires 5,5 may be reduced enabling to wire the lead wires 5,5 while contacting the aperture 10 of the sheathing frame 2 with the printed circuit board 7.

Figure 12:
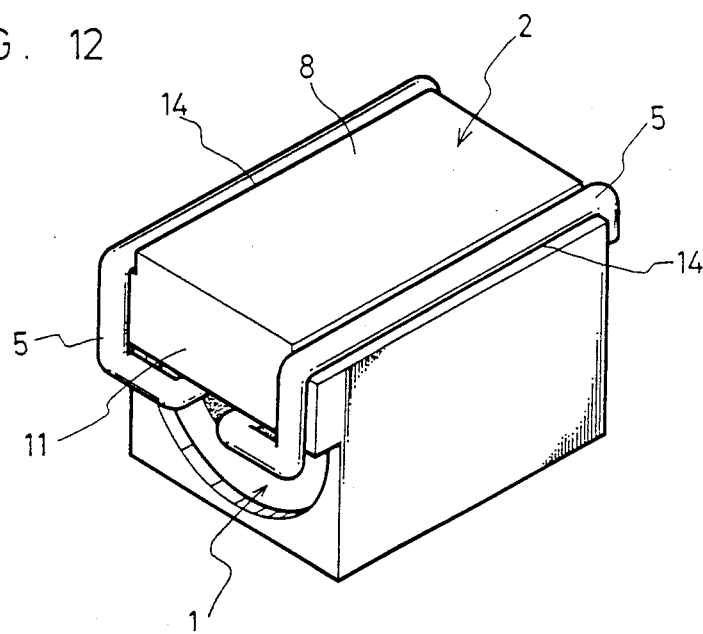
FIG. 12 is a perspective view showing another more embodiment of the chip type capacitor according to the invention.
Figure 13:
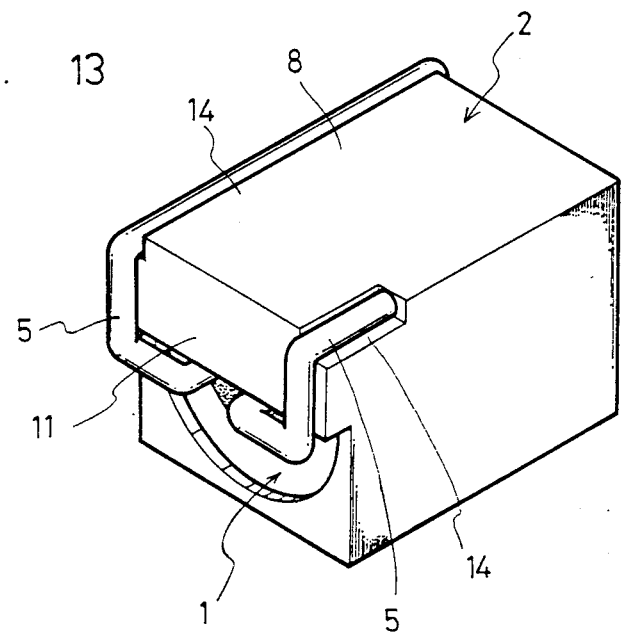
FIG. 13 is a perspective view of an example of change in shape of the chip type capacitor as shown in FIG. 12.

FIG. 12 and FIG. 13 illustrate further embodiments of the chip type capacitor according to the invention. In this embodiment, the noched groove sections 14,14 are provided on the edge sections of either sides of the underside 8 of the sheathing frame 2 with a configuration of the same length as the longitudinal dimension of the sheathing frame 2. In this case, the lead wires 5,5 of the capacitor 1 derived from the aperture 10 of the sheathing frame 2 are bent alongside the wall section 11 and the underside 8 of the sheathing frame 2 for accommodation into the slot sections 14,14 and their tips are further bent alongside the end of the opposite side of the wall section 11 to support the sheathing frame 2. printed circuit board 7 by soldering, the work from either end direction of the sheathing frame 2 may be available to conviniently cope with the diversified wiring patterns of the printed circuit board 7. Further, when either side of the lead wires 5,5 is soldered at both ends of the sheathing frame 2, a creeping distance between each soldering is prolonged so that a short-circuit accident may be prevented.

Moreover, as shown in FIG. 13, the lengths of the notched groove sections 14,14 provided at the edge sections on both sides of the underside 8 of the sheathing frame 2 may be varied each other to set the lengths of each lead wire 5,5 corresponding to the lengths of the notched groove section. In this case, an arrangement of the lead wires 5,5 at both ends of the sheathing frame 2 becomes asymmetric, thereby to easily determine a polarity of the capacitor 1.

FIG. 14 and FIG. 15 illustrate a manufacturing method of making the chip type capacitor according to the invention with a proper arrangement of the lead wires for the sheathing frame.

First of all, the lead wires 5,5 of the capacitor 1 before accommodated in the sheathing frame 2 are derived from each other substantially in parallel from the sealing member 4 of the capacitor 1 as shown in FIG. 14(a). These lead wires 5,5 after being bent in the opposite direction away from each other at substantially the right angle in the vicinity of the lead-out section of the sealing member 4 and being separated at a certain constant distance as shown in FIG. 14(b) and are again bent in parallel. This distance should be compatible with the distance of the wiring pattern of the printed circuit board 7 to be mounted. Meanwhile, an ordinary manufacturing method and a bending jig may be applied to the bending process of the lead wires 5,5.

Then, this capacitor 1 is accommodated as shown in FIG. 14(c) in the sheathing frame 2 having the accommodation space 6 compatible with the dimension of the external diameter of the capacitor 1 and the notched groove section 14, 14 provided on the underside 8. Further, the capacitor 1 accommodated in the sheating frame 2 bend the lead wires 5,5 derived from the aperture 10 of the sheathing frame 2 at substantially the right angle to the direction of an arrow mark X alongside the end of the aperture 10 of the sheathing frame 2 and the underside 8 and the wires 5,5 are accommodated in the groove sections 14,14.

According to such a manufacturing method of the chip type capacitor, the pitch between the lead wires 5,5 is determined by an ordinary lead wire bending process, before accommodating the capacitor 1 into the sheathing frame 2. Accordingly, after accommodating the capacitor 1 into the sheathing frame 2, it may secure a proper separating distance by merely orientating the lead wires 5,5 to the underside 8 and bending them at substantially the right angle.

Meanwhile, this embodiment has described the case where the lead wires 5,5 are accommodated in the groove sections 14,14 provided in the underside 8 of the sheathing frame 2 but as aforementioned the distance of the lead wires 5,5 is determined before accommodating the lead wire into the sheathing frame 2 free of the groove sections 14,14, nevertheless an accommodation of the lead wires 5,5 into the groove sections 14,14 is extremely effective to secure their stability at the underside 8 of the sheathing frame 2.

Further in this embodiment, the lead wires 5,5 are distanced from each other at a pitch shorter than the dimension of the external diameter of the capacitor 1, so that they may be distanced at the longer pitch. In this case, the lead wires 5,5 are slighly bent in the direction to the center section at the lead-out section from the sealing member 4, and the distance between the lead wires 5,5 is momentarily formed shorter than the dimension of the internal diameter of the accommodating space 6 of the sheathing frame 2 and then, after accommodating the capacitor 1 into the sheathing frame 2, the distance between the lead wires 5,5 is restored to the original condition.

As a manufacturing method according to the invention, the sheathing frame 2 configured as shown in FIG. 15 may be used. Namely, in the sheathing frame 2 as shown in FIG. 15, the lead wire inserting grooves 18,18 are provided to position outside from an outer periphery surface of the capacitor 1 at both edge sections of the aperture 10. When the sheathing frame 2 is used, the lead wires 5,5 derived from the capacitor 1 are distanced in advance longer than the dimension of the external diameter of the capacitor 1 and then, when the capacitor 1 is accommodated into the sheathing frame 2, the lead wires 5,5 are inserted into the lead wire inserting grooves 18,18. Then, the lead wires 5,5 led out from the end of the aperture 10 of the sheathing frame 2 are bent alongside their ends and the underside 8.

Even though the distance between the lead wires 5,5 is more enlarged than the dimension of the external diameter of the capacitor 1, the capacitor 1 may conveniently be accommodated into the sheathing frame 2.

Figure 16:
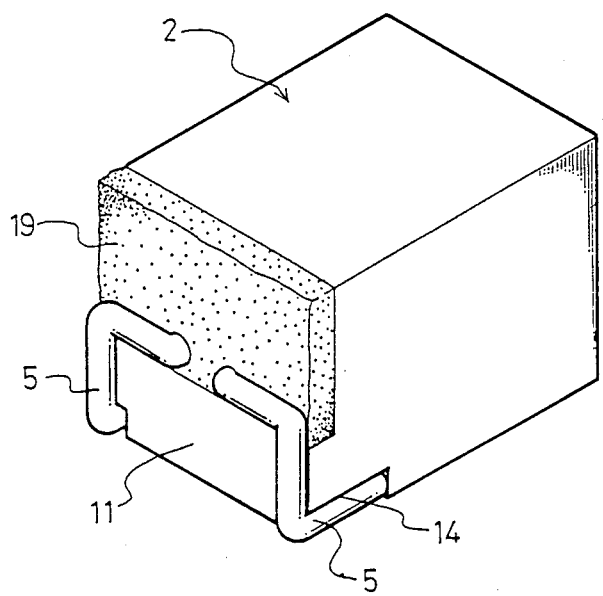
FIG. 16 is a perspective view showing another more embodiment of the chip type capacitor according to the invention.
Figure 17A:
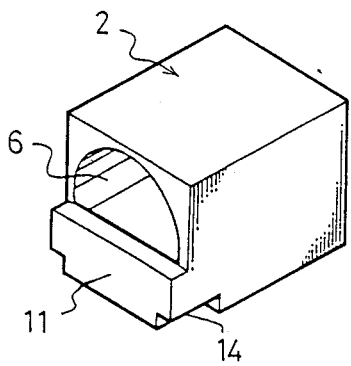
FIGS. 17(a), (b) and (c) are pictorial views of the manufacturing process descriptive of embodiments of the chip type capacitor as shown in FIG. 16.
Figure 17B:
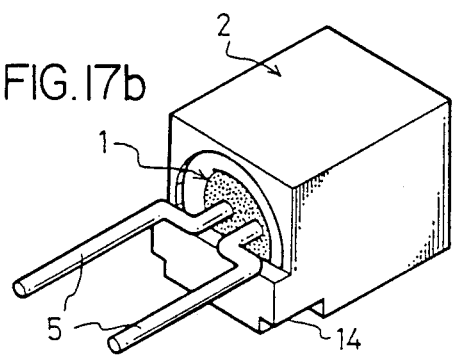

FIG. 16 and FIG. 17 illustrate further embodiments of the chip type capacitor and manufacturing thereof acording to the invention. FIG. 16 illustrates the chip type capacitor according to the embodiment. Namely, in this embodiment, a resin layer 19 is provided to cover the aperture 10 of the sheathing frame 2 in which the capacitor 1 is accommodated. It may be sufficient enough for the resin layer 19 to cover at least a part of the sealing member 4 from which the lead wires 5,5 of the capacitor 1 are extended. Also, as a means of forming the resin layer 19, any means may be used, for example, it may be formed by coating a molten synthetic resin material over an essential part with solidification.

Figure 17C:
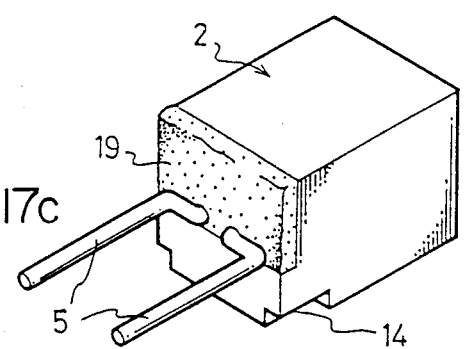

Next, the manufacturing method of the chip type capacitor thus configured is further described with reference to FIG. 17. At first, the capacitor 1 with the lead wires 5,5 bent and processed as shown in FIG. 14(a) and (b) are accommodated into the sheathing frame 2 configured as shown in FIG. 17(a) and (b). Then a molten synthetic resin material, for example, a thermosetting synthetic resin material of an excellent heat resistance is applied to cover the end of the aperture 10 of the sheathing frame 2 for subsequent solidification thereby to obtain a resin layer 19 (FIG. 17(c)). The lead wires 5,5 protruded from the resin layer 19 are bent alongside from the end of said resin layer 19 to the surface of the wall section 11 of the sheathing frame 2 and the underside 8 for accommodation into the groove sections 14,14 provided on the underside 8 of the sheathing frame 2 to obtain the chip type capacitor having the resin layer 19 thus formed on the aperture 10 of the sheathing frame 2.

According to this embodiment, the lead wires 5,5 are bent after the resin layer 19 has been formed on the aperture 10 of the sheathing frame 2. Accordingly, the stress to be caused by bending the lead wires 5,5 does not directly influence the body of the capacitor 1 inside the sheathing frame 2 but is rather reduced with improved reliability.

Furthermore, when the resin layer 19 entirely covers the aperture 10 of the sheathing frame 2, the thermal stress to the body of the capacitor 1 is reduced. Meanwhile, the chip type capacitor having the capacitor accommodated in the conventional closed-end cylindrical sheathing frame has such a disadvantage that impurities such as detergents and the like are intermixed through the inserting holes of the lead wires for penetration through the sealing member of the capacitor with corrosion of the capacitor elements. According to the chip type capacitor of the present invention, however, at least the lead-out section of the lead wires 5,5 is covered with the resin layer 19 so that the penetration of detergents such as Freon and the like is prevented for effective escape from corrosion.

As is obvious from the aforementioned embodiments, according to the invention, a chip type capacitor most suitable for mounting on the surface of the printed circuit board may be obtained at a reduced cost without providing any substantial change in the structure per se of an ordinary capacitor.

Further, by providing the wall section in the aperture of the sheathing frame to cover a part thereof, the capacitor is positioned and fixed in the accommodating space of the sheathing frame eliminating the work of inserting lead wires through the through-holes provided in the closed-end section of the sheathing frame like the conventional one free of any sophisticated processing accuracy to manufacture a chip type capacitor with a convenient step and at a low cost.

Although the invention has been described hereinabove with its preferred embodiments, many variations and modifications may be made with keeping several advantages as shown hereinabove but without departing from the scope and spirit of the invention.

What is claimed is:

1. In combination with a printed circuit board having a flat mounting surface, a chip type capacitor comprising a capacitor having lead wires extending from terminals thereof and a sheathing frame having an accommodating space in which is disposed said capacitor, said sheathing frame having a flat side face on one longitudinally peripheral end of which a protuberance of a height substantially identical to the thickness of the lead wires of the capacitor is provided, said protuberance having a flat surface parallel to a longitudinal axis of said capacitor, said lead wires being bent from an aperture in one end face of said sheathing frame toward the opposite end face of said sheathing frame and being in close contact with said side face of said sheathing frame, said flat surface abutting against and being fixed on said flat mounting surface of said printed circuit board.

2. Structure according to claim 1, wherein lead wires of the capacitor contained in the sheathing frame are bent alongside from one end of the aperture of the sheathing frame to the underside and also at least a lead wire on one side is led to an end opposed to the leading side of lead wires of the sheathing frame.

3. Structure according to claim 1, wherein a resin layer is at least arranged to cover a lead-out section of the lead wires from the capacitor sealing compound for one side of the aperture of the sheathing frame from which the lead wire of the capacitor accommodated in the sheathing frame are led out.

4. Structure according to claim 1, wherein a wall section is arranged at an end of an aperture on one side of the sheathing frame to cover a part thereof and lead wires of the capacitor accomodated in the sheathing frame are bent alongside from an aperture on one side of the sheathing frame to the wall section and the underside.

5. Structure according to claim 4, wherein slot sections are arranged to contain lead wires on the wall section arranged at an end of the aperture on one side of the sheathing frame to cover a part thereof over which lead wires of the capacitor are bent.

6. Structure according to claim 4, wherein a protuberance of a height at least higher than a dimension of an external diameter of lead wires of a capacitor is arranged on the wall section arranged at an end of the aperture on one side of the sheathing frame to cover a part thereof.

7. In combination with a printed circuit board having a flat mounting surface, a chip type capacitor comprising a capacitor having lead wires extending from terminals thereof and a sheathing frame having an accommodating space in which is disposed said capacitor, said sheathing frame having one end face on which is formed an aperture through which lead wires extend and a wall section for partially covering said aperture, said sheathing frame being provided with another aperture on the opposite end face thereof, notched slot sections for receiving the lead wires being provided on a side face of said sheathing frame which is parallel to a longitudinal axis of said capacitor and serves as a contact face upon mounting, or on corner portions at which said side face and other side faces adjacent thereto encounter each other, said lead wires being bent along said wall section in close contact therewith and then received in said notched slot sections such that the overall area of said side face of said sheathing frame directly abuts against and is fixed on a mounting surface of said printed circuit board.

8. Structure according to claim 7, wherein slot sections are arranged on the wall section arranged at an end of the aperture on one side of the sheathing frame for covering a part thereof over which lead wires of the capacitor are bent to accommodate lead wires.

9. Structure according to claim 7, wherein a protuberance of a height at least higher than the dimension of the external diameter of the lead wires of the capacitor is arranged on the wall section arranged at the end of aperture on one side of the sheathing frame for covering a part thereof.

10. Structure according to claim 9, wherein a protuberance of a height substantially identical to the height of the protuberance arranged on the wall section is formed at an end of the aperture provided on said protuberance.

11. Structure according to claim 7, wherein lead wires of the capacitor accommodated in the sheathing frame are bent alongside from one end of the aperture of the sheathing frame to the underside thereof and also at least lead wire on one side is led to an end opposed to the leading side of lead wires of the sheathing frame.

12. Structure according to claim 7, wherein a resin layer is arranged for one side of aperture of the sheathing frame from which lead wires of the capacitor accommodated in the sheathing frame are led out to cover at least a lead-out section of lead wires from the capacitor sealing body.

13. A method for manufacturing the combination of a printed circuit board having a flat mounting surface and a chip type capacitor comprising a capacitor having lead wires extending from terminals thereof and a sheathing frame having an accommodating space in which is disposed said capacitor, which comprises the steps of:

establishing a predetermined distance between said lead wires;

inserting the capacitor into said sheathing frame through an aperture in an end face of said sheathing frame;

bending said lead wires toward the opposite end face of the sheathing frame along a side face of the sheathing frame which is parallel to a longitudinal axis of the capacitor and serves as a contact face upon mounting, so as to be in close contact with a first portion of said side face, a second portion of said side face being flat and protruding beyond said first portion a distance equal to the thickness of said lead wires; and securing said flat second portion of said side face to said flat mounting surface of said printed circuit board.

14. A method of manufacturing a combination according to claim 13, wherein a distance between each lead wire is formed beforehand larger than the dimension of the external shape of the capacitor and also lead wires are bent in the vicinity of a lead-out section of lead wires derived from an end of the aperture of the sheathing frame and then tacked below the dimension of the internal diameter of the accommodating space of the sheathing frame and the capacitor is accommodated into the sheathing frame before lead wires are again bent at the lead-out section for restoration to the original dimension.

15. A method of manufacturing a combination according to claim 13 wherein a capacitor is accommodated in the sheathing frame and a resin layer is provided in one side of the aperture of the sheathing frame from which lead wires of the capacitor are derived, at least to cover a lead-out section of lead wires from the capacitor sealing body before lead wires are bent alongside from the end of the aperture of the sheathing frame to the underside thereof.

* * * * *